United States Patent [19]
Kikkawa

[11] Patent Number: 4,816,895
[45] Date of Patent: Mar. 28, 1989

[54] INTEGRATED CIRCUIT DEVICE WITH AN IMPROVED INTERCONNECTION LINE

[75] Inventor: Takamaro Kikkawa, Tokyo, Japan
[73] Assignee: NEC Corporation, Tokyo, Japan
[21] Appl. No.: 21,924
[22] Filed: Mar. 5, 1987
[30] Foreign Application Priority Data Mar. 6, 1986 [JP] Japan ................................. 61-47187

[51] Int. Cl.⁴ ............................................. H01L 23/54
[52] U.S. Cl. ......................................... 357/71; 357/67
[58] Field of Search ........................... 357/71, 675, 67; 148/DIG. 19, DIG. 147

[56] References Cited

U.S. PATENT DOCUMENTS

| | | | |
|---|---|---|---|
| 3,699,011 | 10/1972 | Nishimura | 174/68.5 X |
| 3,702,427 | 11/1972 | Learn et al. | 174/68.5 X |
| 4,003,772 | 1/1977 | Hanazono et al. | 357/71 X |
| 4,180,596 | 12/1979 | Crowder et al. | 357/71 X |
| 4,190,466 | 2/1980 | Bhattacharyya et al. | 357/36 X |
| 4,507,852 | 4/1985 | Karulkar | 357/71 X |
| 4,554,572 | 11/1985 | Chatterjee | 357/71 X |
| 4,561,009 | 12/1985 | Yonezawa et al. | 357/71 X |
| 4,566,940 | 1/1986 | Itsumi et al. | 357/5 X |
| 4,734,754 | 3/1988 | Nikawa | 357/71 R |

FOREIGN PATENT DOCUMENTS 2169446  7/1986  United Kingdom .................. 357/71

OTHER PUBLICATIONS

Ryoichi Tomoziki, Flattening in Multi-Layer WIRING, SEMICONDUCTOR WORLD, Oct. 1984, pp. 116-120; translation attached in 357/67S.

*Primary Examiner*—R. R. Kucia
*Attorney, Agent, or Firm*—Helfgott & Karas

[57] ABSTRACT

A semiconductor device including interconnection lines for connecting element regions is disclosed. Each of interconnection lines is comprised of a first layer consisting essentially of aluminum, an alumina film formed on the first layer and a second layer containing silicon and deposited on the alumina film. Refractory metal silicide such as tungsten silicide, molybdenum silicide, titanium silicide, tantalum silicide and chrominum silicide is favorably employed as the second layer. Hillock formation and electromigration are thus prevented or suppressed.

4 Claims, 3 Drawing Sheets

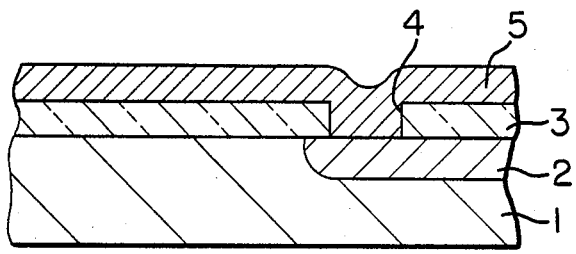
FIG. IA
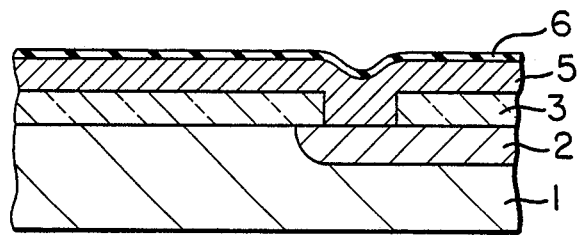
FIG. IB
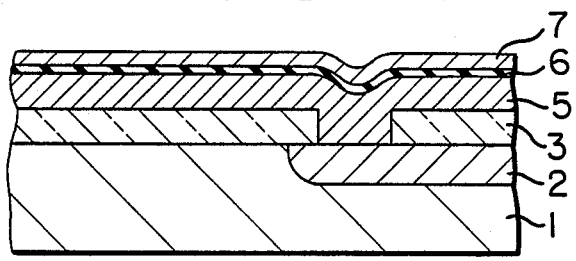
FIG. IC
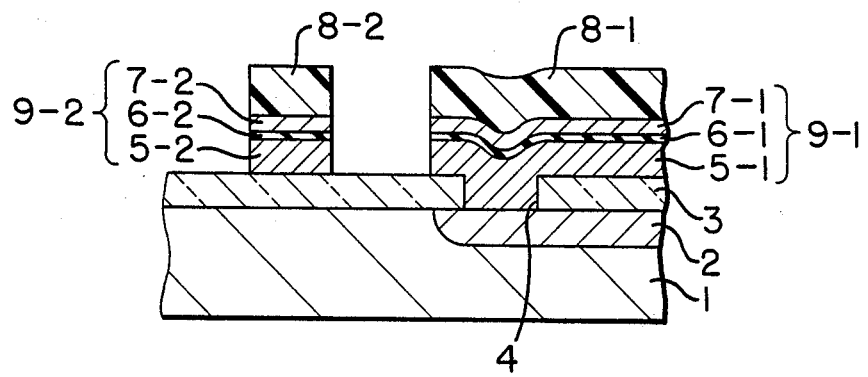
FIG. ID

INTEGRATED CIRCUIT DEVICE WITH AN IMPROVED INTERCONNECTION LINE

BACKGROUND OF THE INVENTION

The present invention relates to a semiconductor integrated circuit device (hereinafter referred to as an "IC"), and more particularly to aluminum interconnection lines in an IC.

With advances in integrated circuit technology, circuit element dimentions are being scaled down and interconnection lines are being made fine, so that a high integration density IC is obtainable. Such an IC has a multilevel interconnection structure, and each level interconnection line is made of a low resistivity material, i.e. aluminum, in order to suppress a signal transmission delay.

A problem occurring therein is formation of hillock which canses a short-circuit between lower and upper level aluminum interconnection lines. In order to prevent the hillock formation, it has been proposed that the surface of the aluminum interconnection line is covered with a layer of refractory metal such as titanium, molybdenum, etc.

Another problem of the aluminum interconnection line is electromigration of aluminum, which causes breaking down of fine interconnection lines.

It has been newly found that the aluminum interconnection line covered with the refractory metal layer is poor in preventing the breaking down due to the electromigration.

SUMMARY OF THE INVENTION

Therefore, an object of the present invention is to provide a semiconductor integrated circuit device having an improved interconnection line.

Another object of the present invention is to provide an interconnection line structure in a semiconductor device which can prevent breaking down due to electro-migration and hillock formation.

A device according to the present invention is characterized in that an interconnection line comprises a first layer consisting essentially of aluminum, an aluminum oxide film formed on a upper surface of the first layer and a second layer including silicon and deposited on the aluminum oxide film.

The second layer may consist of silicide of refractory metal and is favorably selected from tungsten silicide, molybdenum silicide, titanium silicide, tantalum silicide and chromium silicide.

The interconnection line according to the present invention can prevent hillock formation and suppress the electromigration. Accordingly, the present invention provides a high integration density IC with a high reliability.

BRIEF DESCRIPTION OF THE DRAWINGS

The above and other objects, advantages and features of the present invention will be more apparent from the following description taken in conjunction with the accompanying drawings, in which:

FIG. 1A to FIG. 1D are cross-sectional views in the respective manufacturing steps of a device according to an embodiment of the present invention;

DETAILED DESCRIPTION OF THE EMBODIMENTS

Figure 2:
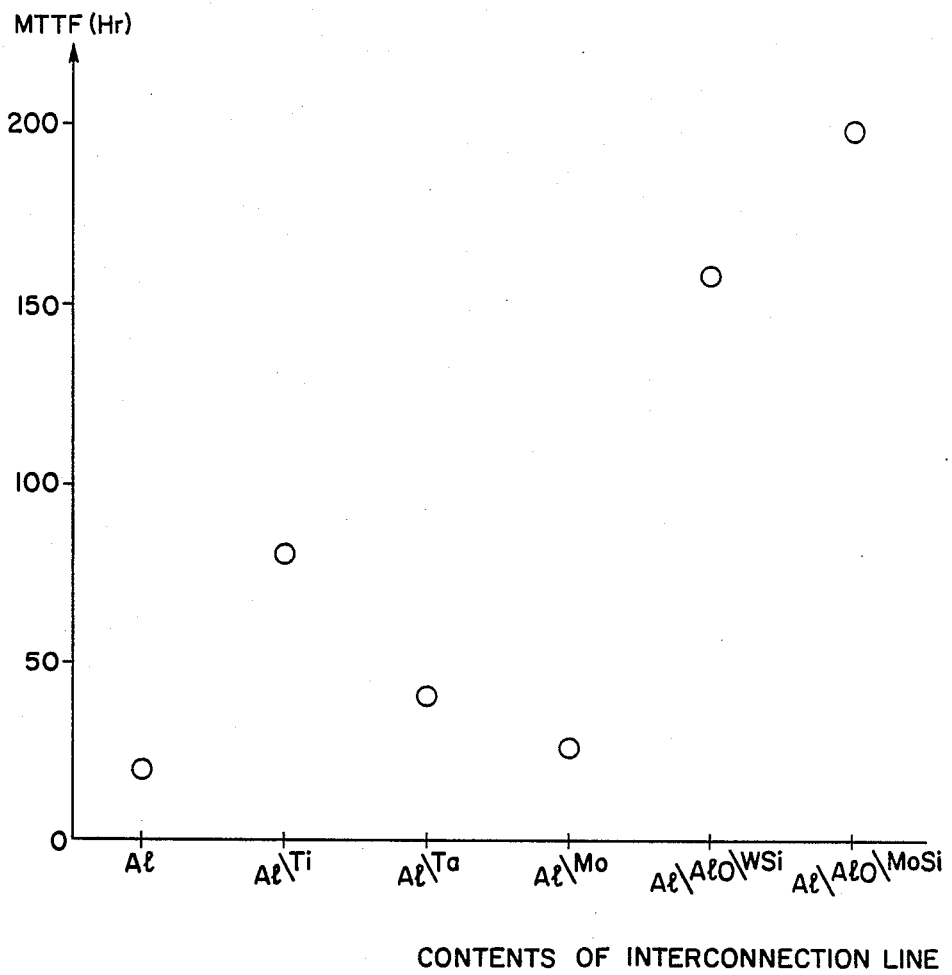
FIG. 2 shows "mean time to failure (MTTF)" values for interconnection lines of various contents.

Referring to FIG. 1A, a substrate 1 of silicon is prepared in which a number of circuit elements such as transistors and resistors are formed (only one element region 2 is shown in order to avoid the complexity of the drawing). The region 2 has an opposite conductivity type to the substrate 1. The surface of the silicon substrate 1 is covered with a silicon oxide layer 3 which is provided with a plurality of contact holes (only one contact hole 4 is shown in FIG. 1) to expose a part of an associated element region 2. The silicon substrate 1 with the above-mentioned structure is placed in a D.C. magnetron sputtering equipment to deposit an aluminum layer 5 of a thickness of about 1 μm which is in contact with the element region 2 through the contact hole 4 and with other element regions through the associated contact holes (not shown).

The silicon substrate 1 is thereafter taken out of the sputting equipment and then exposed in the atmosphere. As a result, an aluminum oxide (alumina) film 6 is formed on the surface of the aluminum layer 5 by native oxidation, as shown in FIG. 1B. If desired, the alumina film 6 may be formed by plasma-oxidizing technique. Since the alumina film 6 has an oxidation-resisting function, the surface of the aluminum layer 5 is oxidized very thin. The thickness of the alumina film 6 is about 50 Å.

Subsequently, the silicon substrate 1 is set again into the sputtering equipment, and a tungsten silicide layer 7 is then deposited on the alumina film 6 with a thickness of about 500 Å, as shown in FIG. 1C.

The silicon substrate 1 is taken out of the sputtering equipment and is then covered with patterned photoresist layers 8-1 and 8-2 employed as an etching mask. The ion etching using $CCl_4$ gas is carried out to selectively remove the tungsten silicide layer 7, the alumina film 6 and the aluminun layer 5. As a result, interconnection lines 9-1 and 9-2 are formed as shown in FIG. 1D. The interconnection line 9-1 is in contact with the element region 2 through the contact hole 4 and is composed of aluminum layer 5-1, alumina film 6-1 and tungsten silicide layer 7-1, and the line 9-2 runs on the oxide layer 3 to contact with another element region (not shown) and is composed of aluminum layer 5-2, alumina film 6-2 and tungsten silicide layer 7-2. In a plan view (not shown), the interconnection line 9-2 extends in a direction perpendicular to a direction in which the line 9-1 is elongated.

A heat treatment is thereafter carried out to enhance an ohmic contact between the aluminum layer 5-1 and the element region 2. The alumina layer 6-1 (6-2) do not disappear by this heat treatment. Accordingly, the tungsten silicide layer 7-1 (7-2) is separated from the aluminum layer 5-1 (5-2) by the alumina layer 6-1 (6-2).

It has been confirmed by the inventor that this structure of tungsten silicide-alumina-aluminum ($WSi_2$-$Al_2O_3$-Al) prevents the hillock formation as well as breaking down of an interconnection line caused by the electromigration. Devices having the interconnection lines of the $WSi_2$-$Al_2O_3$-Al structure were tested at 200° C. with electric currents supplied to the interconnection lines at a current density of $1 \times 10^6$ A/cm$^2$. A time period until breaking down of each interconnection line was measured to get MTTF (mean time to failure). Then, the similar tests were conducted under the same condition for devices employing molybdenum silicide in place of tungsten silicide, devices having interconnection lines of a Ti-Al two-layer structure, those having interconnection lines of a Ta-Al two-layer structure, those having interconnection lines of a Mo-Al two layer structure, and those having interconnection lines an Al single-layer structure, to measure respective values of MTTFs. The results are shown in FIG. 2. The MTTF of the Al single-layer structure is as short as 20 hours and the MTTFs of the Ti-Al, Ta-Al, and Mo-Al two-layer structures are 82 hours, 40 hours and 27 hours, respectively. In contrast, the MTTFs of the WSi$_2$-Al$_2$O$_3$-Al and MoSi$_2$-Al$_2$O$_3$Al three-layer structures according to the invention are as large as 160 hours and 200 hours, respectively. Although the reason why the structure of the present invention provides such a long MTTF is not accumurately known to the inventor, it seems that alumina layer would prevent the alloy reaction between aluminum thereunder and silicide therecover. It has been also confirmed by the inventor that the MTTF becomes short with a structure in which refractory metal is employed in place of its silicide, even though the alumina film is present. This would suggest that the refractory metal deoxidizes alumina of the intervening alumina film and changes the structure from refractory metal-alumina-aluminum three-layer structure to refractory metal-aluminum two-layer structure.

Other silicides such as titanium silicide, tantalum silicide and chromium silicide than tungsten silicide and molybdenum silicide cause a similar result. The aluminum layer 5 shown in FIG. 1 may contain silicon or copper of about 1 wt.%.

Figure 3A:
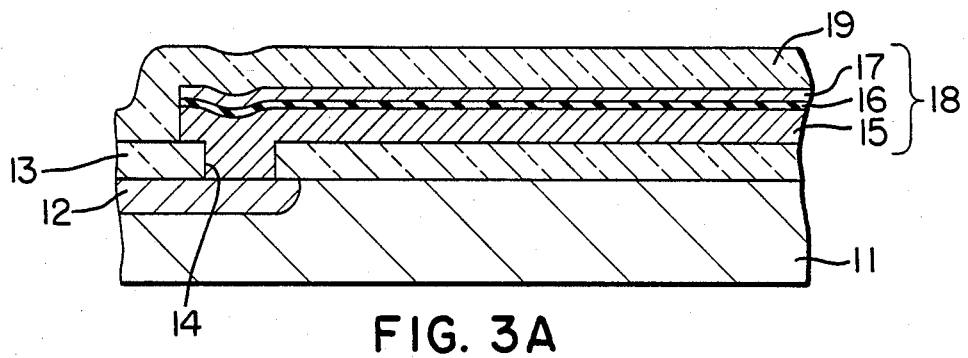
FIG. 3A to FIG. 3C are cross-sectional views in the respective manufacturing steps of a device according to another embodiment of the present invention.

Referring to FIG. 3, another embodiment of the present invention has a multilevel interconnection structure. As shown in FIG. 3A, a first-level interconnection line 18 is formed, which is connected to an element region 12 formed in a silicon substrate 11 through a contact hole 14 provided in a silicon oxide layer 13. This line 18 is composed of an aluminum layer 15, an alumina film 16 and a tungsten silicide layer 17 and is produced in a manner described with reference to FIG. 1. A silicon nitride layer 19 having a thickness of 1 μm is deposited by plasma CVD (chemical vapor deposition) using ammonia and silane gases over the substrate with the first-level interconnection line 18.

Figure 3B:
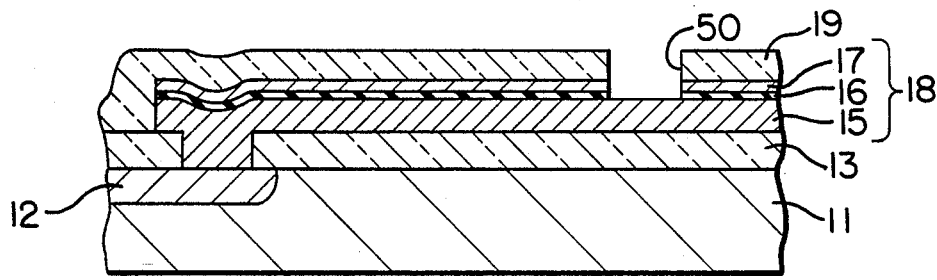

The silicon nitride layer 19 is then selectively etched away by plasma etching technique using mixture gas of CF$_4$ and O$_2$, as shown in FIG. 3B. At this time, the tungsten silicide layer 17 is also etched. The alumina film 16 is then selectively etched by the reverse sputtering employing argon ions. As a result, a contact hole 50 for an electrical connection between a second-level interconnection line and the first-level line 18 is formed. The contact hole 50 exposes a contact portion of the aluminum layer 15.

Figure 3C:
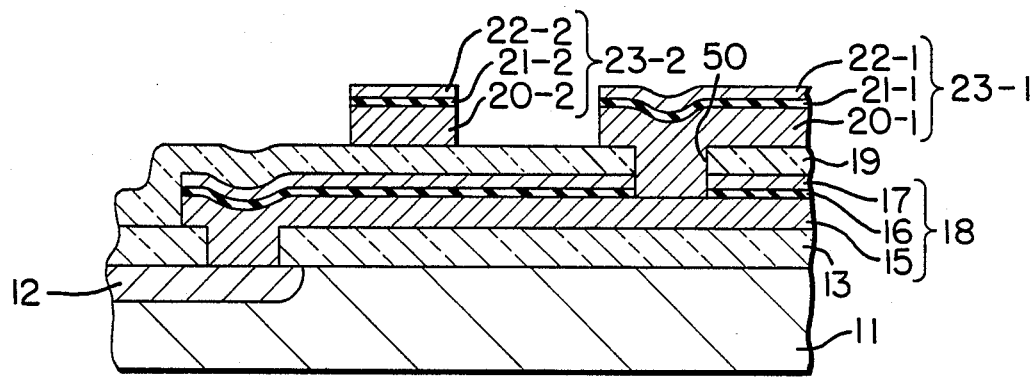

Subsequently, an aluminum layer, an alumina film and a tungsten silicide layer are successively deposited in that order and patterning is then carried out. As a result, second-level interconnection lines 23-1 and 23-2 are formed as shown in FIG. 3C. The line 23-1 is in contact with the first-level interconnection line 18 through the contact hole 50 and is composed of aluminum 20-1, alumina 21-1 and tungsten silicide 22-1, while the line 23-2 crosses over the first-level interconnection line 18, isolated therefrom by the silicon nitride layer 19. The line 23-2 is also composed of aluminum 20-2, alumina 21-2 and tungsten silicide 22-2. The interconnection lines 23-1 and 23-2 are extended in directions perpendicular to each other.

The tungsten silicide layer 17 of the first level line 18 prevents a short-circuit between the first-level and second-level interconnection lines 18 and 23-2 caused by the hillock formation, and alumina films 16, 21-1 and 21-2 suppress remarkably the electromigration of the interconnection lines 18, 23-1 and 23-2. Accordingly, an IC of high reliability is provided.

Figure 4:
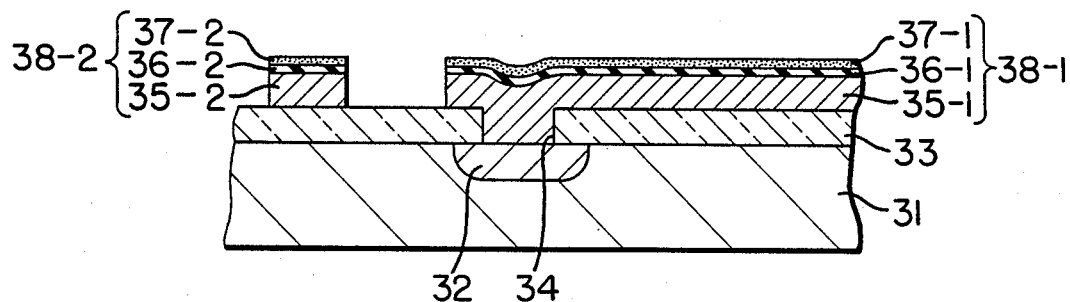
FIG. 4 is a cross-sectional view of a still another embodiment of the present invention.

FIG. 4 shows still another embodiment of the present invention. An interconnection line 38-1 is connected to an element region 32 formed in a silicon substrate 31 through a contact hole 34 provided in a silicon oxide layer 33. The line 38-1 is composed of an aluminum layer 35-1, an alumina film 36-1 and a silicon layer 37-1. Another interconnection line 38-2 is formed on the oxide layer 33 to be connected to another element region (not shown). The line 38-2 is composed of an aluminum layer 35-2, an alumina film 36-2 and a silicon layer 37-1. The alumina layer 36-1 (36-2) suppresses the alloy reaction between aluminum and silicon, or, the diffusion of silicon into the aluminum layer.

In this embodiment, the silicon layer 37 is employed in place of the refractory metal silicide layer. The refractory metal and its silicide are expensive as compared with silicon, and therefore a cost of the IC of this embodiment is reduced. The silicon layer 37 has the substantially same effect as the refractory metal silicide with respect to the prevention of hillock formation. With respect to electromigration, however, the MTTF of the line 38 in this embodiment is shorter than the lines 9, 18 and 23 of FIGS. 1 and 3.

As described above, a device according to the prevent invention has extremely high reliability per cost.

It is apparent that the present invention is not limited to the above embodiments but may be changed and modified without departing from the scope and spirit of the present invention.

What is claimed is:

1. A semiconductor device comprising a semiconductor substrate, at least one element region formed in said semiconductor substrate, an insulating film covering said semiconductor substrate and having a contact hole which exposes one portion of said at least one element region, a first interconnection line making contact with said one portion of said at least one element region through said contact hole and extending over said insulating film, and a second interconnection line formed on said insulating film separately from said first interconnection line, each of said first and second interconnection lines comprising an aluminum layer, an alumina film formed on said aluminum layer, and a refractory metal silicide layer formed on said alumina film, said alumina film preventing an alloy reaction between said aluminum layer and said refractory metal silicide layer, said refractory metal silicide layer inhibiting hillock formation of said aluminum layer and electromigration of aluminum in said aluminum layer to prevent a breakdown of said interconnection lines.

2. The device as claimed in claim 1, wherein said refractory metal silicide layer is selected from tungsten silicide, molybdenum silicide, titanium silicide, tantalum silicide and chromium silicide.

3. The device as claimed in claim 1, wherein said aluminum layer contains a metal selected from the group consisting of silicon and copper.

4. The device as claimed in claim 1, wherein said alumina film has a thickness of about 50Å.

* * * * *